United States Patent
Riker et al.

(10) Patent No.: US 9,960,024 B2
(45) Date of Patent: *May 1, 2018

(54) BIASABLE FLUX OPTIMIZER / COLLIMATOR FOR PVD SPUTTER CHAMBER

(71) Applicant: Applied Materials, Inc., Santa Clara, CA (US)

(72) Inventors: Martin Lee Riker, Milpitas, CA (US); Fuhong Zhang, San Jose, CA (US); Anthony Infante, San Mateo, CA (US); Zheng Wang, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/277,674

(22) Filed: Sep. 27, 2016

(65) Prior Publication Data

US 2017/0117121 A1 Apr. 27, 2017

Related U.S. Application Data

(60) Provisional application No. 62/246,967, filed on Oct. 27, 2015.

(51) Int. Cl.
*H01J 37/34* (2006.01)
*C23C 14/04* (2006.01)

(52) U.S. Cl.
CPC ........ *H01J 37/3447* (2013.01); *C23C 14/046* (2013.01); *H01J 37/34* (2013.01)

(58) Field of Classification Search
CPC ....... C23C 14/046; C23C 14/35; C23C 14/54; H01J 37/3447

(Continued)

(56) References Cited

U.S. PATENT DOCUMENTS

| 5,362,372 A | 11/1994 | Tepman |
| 5,380,414 A | 1/1995 | Tepman |

(Continued)

FOREIGN PATENT DOCUMENTS

| EP | 0703598 | * 3/1996 |
| JP | 06-295903 | * 10/1994 |

(Continued)

OTHER PUBLICATIONS

Machine Translation JP 06-295903 dated Oct. 1994.*

(Continued)

*Primary Examiner* — Rodney G McDonald
(74) *Attorney, Agent, or Firm* — Patterson + Sheridan, LLP

(57) ABSTRACT

In some implementations described herein, a collimator that is biasable is provided. The ability to bias the collimator allows control of the electric field through which the sputter species pass. In some implementations of the present disclosure a collimator that has a high effective aspect ratio while maintaining a low aspect ratio along the periphery of the collimator of the hexagonal array of the collimator is provided. In some implementations, a collimator with a steep entry edge in the hexagonal array is provided. It has been found that use of a steep entry edge in the collimator reduces deposition overhang and clogging of the cells of the hexagonal array. These various features lead to improve film uniformity and extend the life of the collimator and process kit.

15 Claims, 8 Drawing Sheets

(58) Field of Classification Search
 USPC .................................................. 204/298.11
 See application file for complete search history.

(56) References Cited

U.S. PATENT DOCUMENTS

| | | | |
|---|---|---|---|
| 5,415,753 | A | 5/1995 | Hurwitt et al. |
| 5,431,799 | A | 7/1995 | Mosely et al. |
| 5,544,771 | A | 8/1996 | Lee et al. |
| 5,650,052 | A | 7/1997 | Edelstein et al. |
| 5,658,442 | A | 8/1997 | Van Gogh et al. |
| 6,149,776 | A | 11/2000 | Tang et al. |
| 6,362,097 | B1 | 3/2002 | Demaray et al. |
| 6,482,301 | B1 | 11/2002 | Chen et al. |
| 7,048,837 | B2 | 5/2006 | Somekh et al. |
| 9,543,126 | B2 | 1/2017 | Riker |
| 2003/0015421 | A1 | 1/2003 | Cha et al. |
| 2003/0029715 | A1 | 2/2003 | Yu et al. |
| 2004/0211665 | A1 | 10/2004 | Yoon et al. |
| 2006/0249369 | A1 | 11/2006 | Marangon et al. |
| 2007/0228302 | A1* | 10/2007 | Norman, Jr. ............ H01J 37/34 250/505.1 |
| 2009/0308372 | A1 | 12/2009 | Nordberg et al. |
| 2009/0308732 | A1 | 12/2009 | Cao et al. |
| 2009/0308739 | A1* | 12/2009 | Riker ...................... H01J 37/34 204/298.11 |
| 2015/0034481 | A1* | 2/2015 | Ishihara ................ C23C 14/564 204/298.11 |
| 2015/0114823 | A1 | 4/2015 | Lee et al. |

FOREIGN PATENT DOCUMENTS

| | | |
|---|---|---|
| JP | 2007273490 A | 10/2007 |
| KR | 1019970017999 A | 4/1997 |
| WO | 2004047160 A1 | 6/2004 |
| WO | 2005101472 A1 | 10/2005 |

OTHER PUBLICATIONS

International Search Report and Written Opinion for International Application No. PCT/US2016/053970 dated Jan. 11, 2017.

* cited by examiner

BIASABLE FLUX OPTIMIZER / COLLIMATOR FOR PVD SPUTTER CHAMBER

CROSS-REFERENCE TO RELATED APPLICATIONS

This application claims benefit of U.S. provisional patent application Ser. No. 62/246,967, filed Oct. 27, 2015. The aforementioned related patent application is herein incorporated by reference in its entirety.

BACKGROUND

Field

Implementations of the present disclosure generally relate to an apparatus and method for uniform sputter deposition of materials into the bottom and sidewalls of high aspect ratio features on a substrate.

Description of the Related Art

Reliably producing sub-half micron and smaller features is one of the key technology challenges for next generation very large-scale integration (VLSI) and ultra large-scale integration (ULSI) of semiconductor devices. However, as the miniaturization of circuit technology continues, the shrinking dimensions of interconnects in VLSI and ULSI technology have placed additional demands on processing capabilities. For example, as circuit densities increase for next generation devices, the widths of interconnects, such as vias, trenches, contacts, gate structures and other features, as well as the dielectric materials therebetween, decrease while the thickness of the dielectric layers remains substantially constant, with the result of increasing the aspect ratios of the features.

Sputtering, also known as physical vapor deposition (PVD) is widely used to deposit metallic features in integrated circuits. Sputtering is used to deposit layers for use as diffusion barriers, seed layers, primary conductors, antireflection coatings, and etch stops. A source material, such as a target, is bombarded by ions strongly accelerated by an electric field. The bombardment ejects material from the target and the material then deposits on the substrate. During deposition, ejected particles may travel in varying directions, rather than generally orthogonal to the substrate surface, resulting in overhanging structures formed on corners of high aspect ratio features in the substrate. Overhang may undesirably result in holes or voids formed within the deposited material, resulting in diminished electrical conductivity of the formed feature. Higher aspect ratio geometries have a higher degree of difficulty to fill without voids.

One technique developed to allow the use of sputtering to deposit thin films in the bottom of a high aspect ratio feature is collimator sputtering. A collimator is a filtering plate positioned between a sputtering source and a substrate. The collimator typically has a uniform thickness and includes a number of passages formed through the thickness. Sputtered material passes through the collimator on its path from the sputtering source to the substrate. The collimator filters out or collects material that would otherwise strike the workpiece at acute angles exceeding a desired angle.

The actual amount of material filtering accomplished by a given collimator depends on the aspect ratio of the apertures through the collimator. Material such as particles traveling on a path approaching normal to the substrate pass through the collimator and are deposited on the substrate. This allows improved coverage in the bottom of high aspect ratio features. However, certain problems exist with the use of prior art collimators, which typically have an overall hexagonal shape. Unfortunately, PVD chambers with prior art collimators often suffer from cell clogging and leave a six-point deposition near an edge of the substrate due to shadowing of the corners of the hexagonal collimator.

Therefore, a need exists for improvements in the uniformity of depositing source materials across a substrate by PVD techniques.

SUMMARY

Implementations of the present disclosure generally relate to an apparatus and method for uniform sputter deposition of materials into the bottom and sidewalls of high aspect ratio features on a substrate. In one implementation, a collimator is provided. The collimator comprises a body having a central region, a peripheral region, and a transitional region disposed between the central region and the peripheral region. The collimator has a first plurality of apertures in the central region having a first aspect ratio, a second plurality of apertures in the peripheral region having a second aspect ratio that is less than the first aspect ratio, and a third plurality of apertures in the transitional region. The third plurality of apertures is cut so that the transitional region forms a conical shape surrounding the central region. The upper portions of the first plurality of apertures, the second plurality of apertures, and the third plurality of apertures include an entrance angle portion.

In another implementation, a collimator is provided. The collimator comprises a honeycomb structure having walls defining and separating hexagonal apertures. The hexagonal apertures include a first plurality of hexagonal apertures in a central region having a first aspect ratio, a second plurality of hexagonal apertures in a peripheral region having a second aspect ratio less than the first aspect ratio, and a third plurality of hexagonal apertures in a transitional region disposed between the central region and the peripheral region. The walls defining the third plurality of apertures of the transitional region form a conical shape surrounding the central region and an upper portion of the walls include an entrance angle portion.

In yet another implementation, a collimator assembly for encircling a sputtering target is provided. The collimator assembly comprises a shield portion coupled with a collimator portion. The collimator portion comprises a body having a central region, a peripheral region, and a transitional region disposed between the central and peripheral regions. The central region has a first plurality of apertures in the central region having a first aspect ratio. The peripheral region has a second plurality of apertures having a second aspect ratio that is less than the first aspect ratio. The transitional region has a third plurality of apertures in the transitional region, wherein the third plurality of apertures are cut so that the transitional region forms a conical shape surrounding the central region. The shield portion comprises a top ring, a support ledge below the top ring, the support ledge extending radially outward, and a cylindrical band extending downward from the support ledge. The cylindrical band has a first vertical or substantially vertical portion, a radially inwardly sloped portion extending downward from the first vertical or substantially vertical portion, and a second vertical or substantially vertical portion extending downward from the radially inward sloped portion, wherein the radially inward sloped portion extends across a portion of the second plurality of apertures in the peripheral region.

In yet another implementation, a collimator assembly for encircling a sputtering target is provided. The collimator assembly comprises a shield portion coupled with a collimator portion. The collimator portion comprises a honeycomb structure having walls defining and separating hexagonal apertures. The hexagonal apertures include a first plurality of hexagonal apertures in a central region having a first aspect ratio, a second plurality of hexagonal apertures in a peripheral region having a second aspect ratio less than the first aspect ratio, and a third plurality of hexagonal apertures in a transitional region disposed between the central region and the peripheral region. The walls defining the third plurality of apertures of the transitional region form a conical shape surrounding the central region and an upper portion of the walls include an entrance angle portion. The shield portion comprises a top ring, a support ledge below the top ring, the support ledge extending radially outward, and a cylindrical band extending downward from the support ledge to an elevation below the honeycomb structure.

In yet another implementation, a substrate-processing chamber is provided. The substrate-processing chamber comprises a chamber body defining an inner volume, a sputtering target disposed in an upper portion of the inner volume, a substrate support disposed below the sputtering target, and a collimator assembly for encircling the sputtering target. The shield comprises a shield portion coupled with a collimator portion. The collimator portion comprises a body having a central region, a peripheral region, and a transitional region disposed between the central region and the peripheral region. The central region has a first plurality of apertures in the central region having a first aspect ratio. The peripheral region has a second plurality of apertures having a second aspect ratio that is less than the first aspect ratio. The transitional region has a third plurality of apertures in the transitional region, wherein the third plurality of apertures are cut so that the transitional region forms a conical shape surrounding the central region. The shield portion comprises a top ring, a support ledge below the top ring, the support ledge extending radially outward, and a cylindrical band extending downward from the support ledge. The cylindrical band has a first vertical or substantially vertical portion, a radially inwardly sloped portion extending downward from the first vertical or substantially vertical portion, and a second vertical or substantially vertical portion extending downward from the radially inward sloped portion, wherein the radially inward sloped portion extends across a portion of the second plurality of apertures in the peripheral region.

In yet another implementation, a substrate-processing chamber is provided. The substrate-processing chamber comprises a chamber body defining an inner volume, a sputtering target disposed in an upper portion of the inner volume, a substrate support disposed below the sputtering target, and a collimator assembly for encircling the sputtering target. The collimator assembly comprises a shield portion coupled with a collimator portion. The collimator portion comprises a honeycomb structure having walls defining and separating hexagonal apertures. The hexagonal apertures include a first plurality of hexagonal apertures in a central region having a first aspect ratio, a second plurality of hexagonal apertures in a peripheral region having a second aspect ratio less than the first aspect ratio, and a third plurality of hexagonal apertures in a transitional region disposed between the central region and the peripheral region. The walls defining the third plurality of apertures of the transitional region form a conical shape surrounding the central region and an upper portion of the walls include an entrance angle portion. The shield portion comprises a top ring, a support ledge below the top ring, the support ledge extending radially outward, and a cylindrical band extending downward from the support ledge to an elevation below the honeycomb structure.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
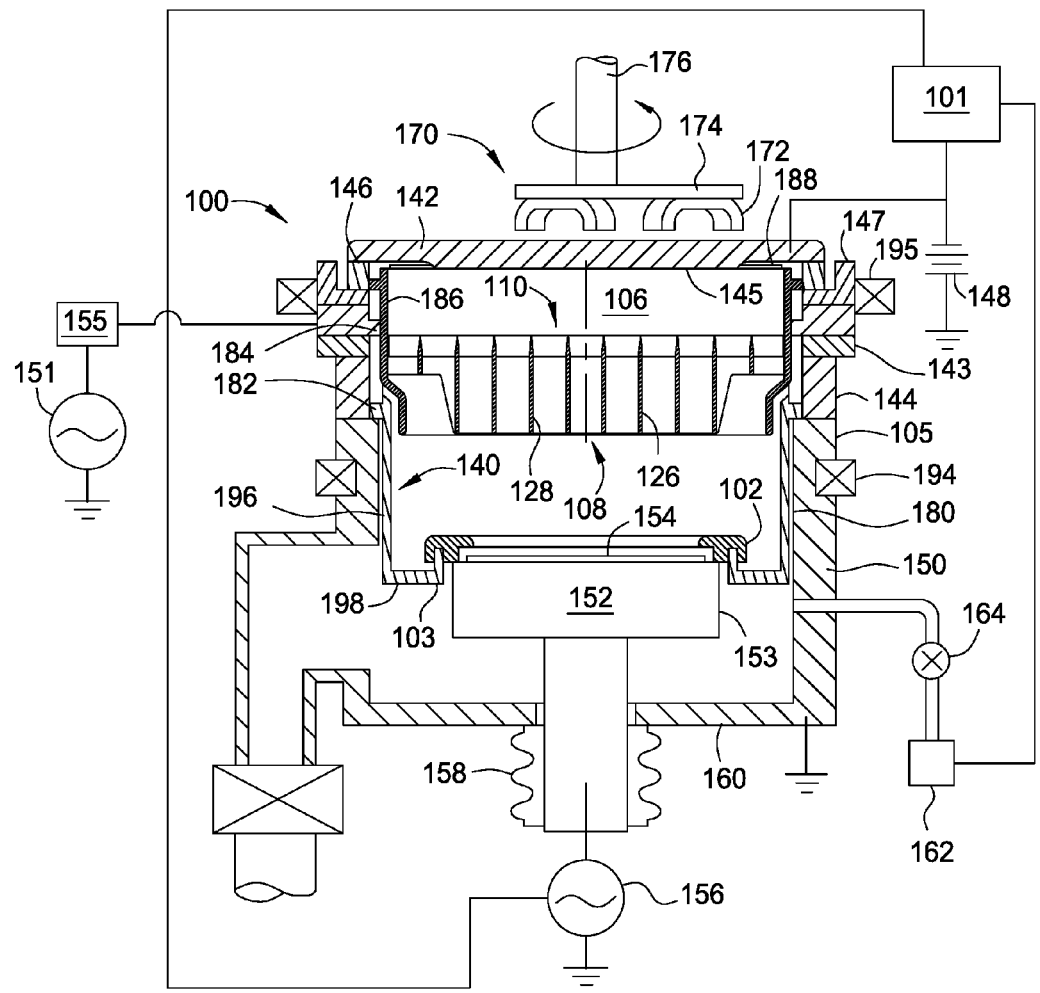
FIG. 1 depicts a schematic cross-sectional view of a substrate-processing chamber with a collimator assembly in accordance with implementations of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes a collimator/flux optimizer for PVD sputtering. Certain details are set forth in the following description and in FIGS. 1-6 to provide a thorough understanding of various implementations of the disclosure. Other details describing well-known structures and systems often associated with collimators and PVD sputtering are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a PVD processing system, such as the EnCoRe® PVD processing chamber available from Applied Materials, Inc. of Santa Clara, Calif. Other tools capable of performing sputtering processes may also be adapted to benefit from the implementations described herein. In addition, any system enabling the sputtering processes described herein can be used to advantage. The apparatus description described herein is illustrative and should not be construed or interpreted as limiting the scope of the implementations described herein.

Physical collimation of PVD sputter plasma has been used to improve sputter results on a substrate by filtering off angle neutral and sputter species before they reach the substrate. In some implementations described herein, a collimator that is biasable is provided. The ability to bias the collimator allows control of the electric field through which the sputter species pass. In some implementations of the present disclosure, a collimator that has a high effective aspect ratio while maintaining a low aspect ratio along the periphery of the collimator of the hexagonal array of the collimator is provided. In some implementations, a collimator with a steep entry edge in the hexagonal array is provided. It has been found that use of a steep entry edge in the collimator substantially reduces deposition overhang and clogging of the cells of the hexagonal array in comparison with prior art collimator designs. Compared to prior art collimator designs, these various features substantially increase film uniformity and extend the life of the collimator and process kit while reducing periods between cleaning.

FIG. 1 depicts an exemplary implementation of a substrate-processing chamber 100 having one implementation of a process kit 140 capable of processing a substrate 154. The processing chamber is coupled with a controller 101. The process kit 140 includes a one-piece lower shield 180 and a collimator assembly 108. The collimator assembly 108 includes a one-piece upper shield portion 186 coupled with a collimator portion 110. In the implementation shown, the processing chamber 100 comprises a sputtering chamber, also called a physical vapor deposition (PVD) chamber, capable of depositing, for example, titanium, aluminum oxide, aluminum, copper, tantalum, tantalum nitride, tungsten, or tungsten nitride, on a substrate. Examples of suitable PVD chambers include the ALPS® Plus and SIP EnCoRe® PVD processing chambers, both commercially available from Applied Materials, Inc., Santa Clara, of Calif. It is contemplated that processing chambers available from other manufactures may benefit from the implementations described herein.

The processing chamber 100 has a chamber body 105 that defines an inner process volume 106. The chamber body 105 includes a chamber wall 150, a grounded conductive adapter 144, and a conductive flange 184 disposed above the chamber wall 150. The chamber wall 150 may be grounded. The conductive flange 184 is positioned between a first dielectric isolator ring 143 and a second dielectric isolator ring 147. One or more RF power sources 151 provide a bias potential through a matching network 155 to the conductive flange 184 to energize the one-piece upper shield portion 186 and the collimator portion 110.

The processing chamber 100 includes a sputtering source, such as a sputtering target 142 having a sputtering surface 145, and a substrate support pedestal 152, for receiving a substrate 154 (e.g., a semiconductor substrate) thereon, the support pedestal 152 having a peripheral edge 153. The substrate support pedestal 152 may be located within the chamber wall 150.

In one implementation, the processing chamber 100 includes the sputtering target 142 supported by the grounded conductive adapter 144 through a dielectric isolator 146. The sputtering target 142 comprises the material to be deposited on the surface of the substrate 154 during sputtering, and may include copper for depositing as a seed layer in high aspect ratio features formed in the substrate 154. In one implementation, the sputtering target 142 may also include a bonded composite of a metallic surface layer of sputterable material, such as copper, and a backing layer of a structural material, such as aluminum.

In one implementation, the substrate support pedestal 152 supports a substrate 154 having high aspect ratio features to be sputter coated, the bottoms of which are in planar opposition to a principal surface of the sputtering target 142. The substrate support pedestal 152 has a planar substrate-receiving surface disposed generally parallel to the sputtering surface 145 of the sputtering target 142. The substrate support pedestal 152 may be vertically movable through a bellows 158 connected to a bottom chamber wall 160 to allow the substrate 154 to be transferred onto the substrate support pedestal 152 through a load lock valve (not shown) in a lower portion of the processing chamber 100. The substrate support pedestal 152 may then be raised to a deposition position as shown.

In one implementation, processing gas may be supplied from a gas source 162 through a mass flow controller 164 into the lower portion of the processing chamber 100. In one implementation, a controllable direct current (DC) power source 148, coupled to the processing chamber 100, may be used to apply a negative voltage or bias to the sputtering target 142. A radio frequency (RF) power source 156 may be coupled to the substrate support pedestal 152 to induce a DC self-bias on the substrate 154. In one implementation, the substrate support pedestal 152 is grounded. In one implementation, the substrate support pedestal 152 is electrically floated.

In one implementation, a magnetron 170 is positioned above the sputtering target 142. The magnetron 170 may include a plurality of magnets 172 supported by a base plate 174 connected to a shaft 176, which may be axially aligned with the central axis of the processing chamber 100 and the substrate 154. In one implementation, the magnets 172 are aligned in a kidney-shaped pattern. The magnets 172 produce a magnetic field within the processing chamber 100 near the front face of the sputtering target 142 to generate plasma, such that a significant flux of ions strike the sputtering target 142, causing sputter emission of target material. The magnets 172 may be rotated about the shaft 176 to increase uniformity of the magnetic field across the surface of the sputtering target 142. In one implementation, the magnetron 170 is a small magnet magnetron. In one implementation, the magnets 172 may be both rotated and moved reciprocally in a linear direction parallel or substantially parallel to the face of the sputtering target 142 to produce a spiral motion. In one implementation, the magnets 172 may be rotated about both a central axis and an independently-controlled secondary axis to control both their radial and angular positions.

In one implementation, a first set of magnets 194 may be disposed adjacent the chamber wall 150 to assist generating an electronic field to the metallic ions dislodged from the sputtering target 142. Furthermore, a second set of magnets 195 may be disposed adjacent to the sputtering target 142 to assist in generating an electrode field to dislodge materials from the sputtering target 142. It is noted that the numbers of the magnets disposed around the processing chamber 100 may be as many as needed to improve plasma dissociation and sputtering efficiency.

In one implementation, the processing chamber 100 includes the one-piece lower shield 180, which may be grounded, having a support flange 182 supported by and electrically coupled to the chamber wall 150. The one-piece upper shield portion 186 is supported by and electrically coupled to the conductive flange 184 of the grounded conductive adapter 144. The one-piece upper shield portion 186 and the one-piece lower shield 180 are electrically coupled, as are the grounded conductive adapter 144 and the chamber wall 150. In one implementation, both the one-piece upper shield portion 186 and the one-piece lower shield 180 are comprised of stainless steel. In another implementation, both the one-piece upper shield portion 186 and the one-piece lower shield 180 are comprised of aluminum. In one implementation, the processing chamber 100 includes a middle shield (not shown) coupled to the one-piece upper shield portion 186. In one implementation, the one-piece upper shield portion 186 and the one-piece lower shield 180 are electrically floating within the processing chamber 100. In one implementation, the one-piece upper shield portion 186 and the one-piece lower shield 180 may be coupled to an electrical power source.

In one implementation, the one-piece upper shield portion 186 has an upper portion that closely fits an annular side recess of the sputtering target 142 with a narrow gap 188 between the one-piece upper shield portion 186 and the sputtering target 142, which is sufficiently narrow to prevent plasma from penetrating and sputter coating the dielectric isolator 146.

In one implementation, the one-piece lower shield 180 extends downwardly into a cylindrical outer band 196, which generally extends along the chamber wall 150 to below the top surface of the substrate support pedestal 152. The one-piece lower shield 180 may have a base plate 198 extending radially inward from the cylindrical outer band 196. The base plate 198 may include an upwardly extending cylindrical inner band 103 surrounding the perimeter of the substrate support pedestal 152. In one implementation, a cover ring 102 rests on the top of the cylindrical inner band 103 when the substrate support pedestal 152 is in a lower, loading position and the cover ring 102 rests on the outer periphery of the substrate support pedestal 152 when the substrate support pedestal 152 is in an upper, deposition position to protect the substrate support pedestal 152 from sputter deposition.

The one-piece lower shield 180 encircles the sputtering surface 145 of the sputtering target 142 that faces the substrate support pedestal 152 and encircles a peripheral wall of the substrate support pedestal 152. The one-piece lower shield 180 covers and shadows the chamber wall 150 of the processing chamber 100 to reduce deposition of sputtering deposits originating from the sputtering surface 145 of the sputtering target 142 onto the components and surfaces behind the one-piece lower shield 180. For example, the one-piece lower shield 180 can protect the surfaces of the substrate support pedestal 152, portions of the substrate 154, the chamber wall 150, and the bottom chamber wall 160 of the processing chamber 100.

In one implementation, directional sputtering may be achieved by positioning the collimator assembly 108 between the sputtering target 142 and the substrate support pedestal 152.

Figure 2A:
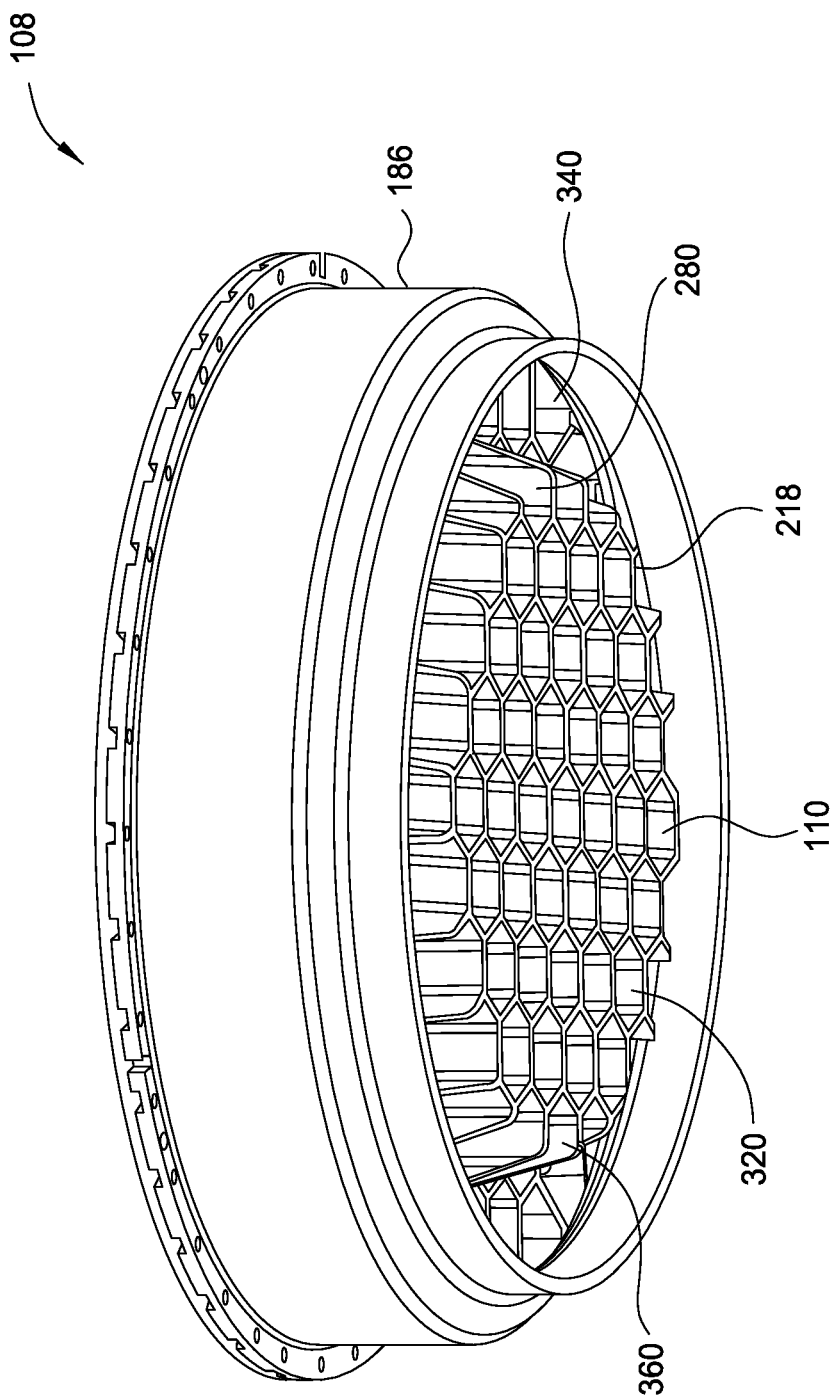
FIG. 2A depicts a perspective view of a collimator assembly in accordance with implementations of the present disclosure.
Figure 2B:
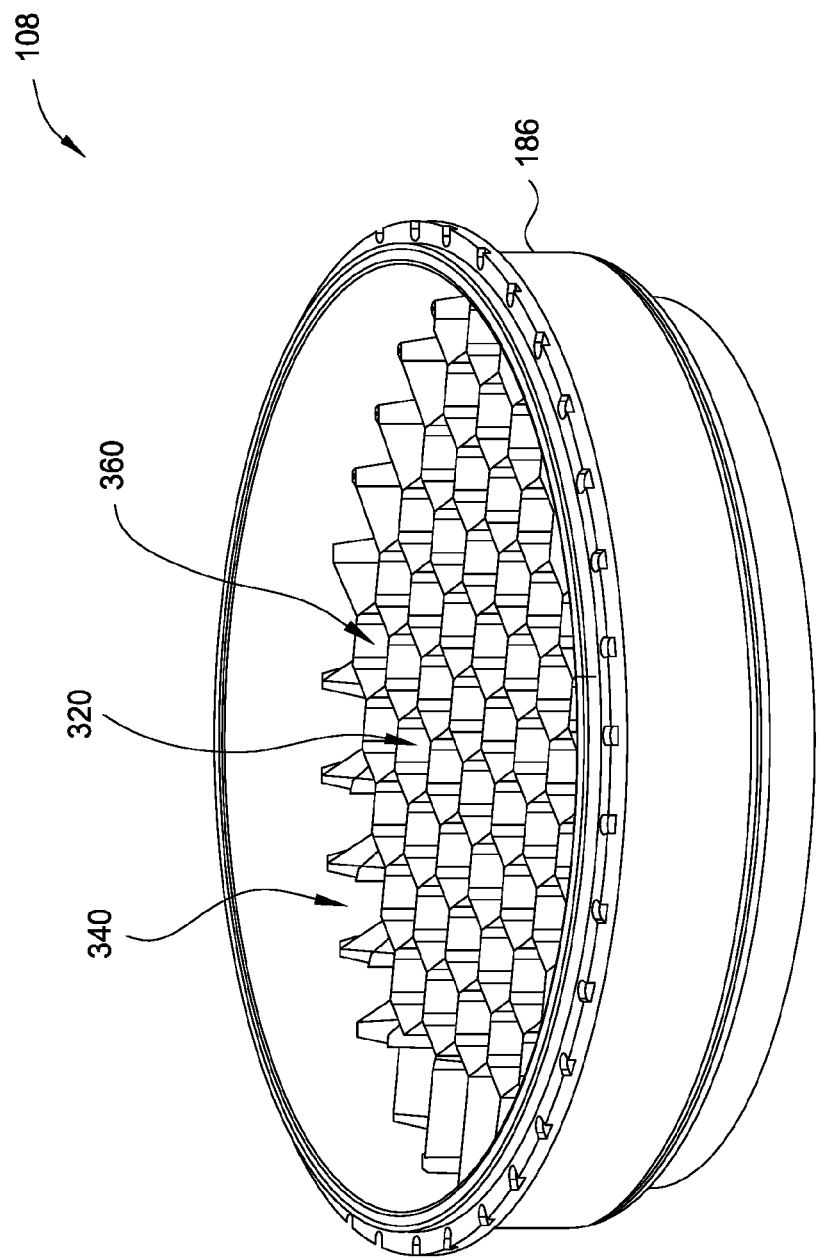
FIG. 2B depicts another perspective view of a collimator assembly in accordance with implementations of the present disclosure.
Figure 3:
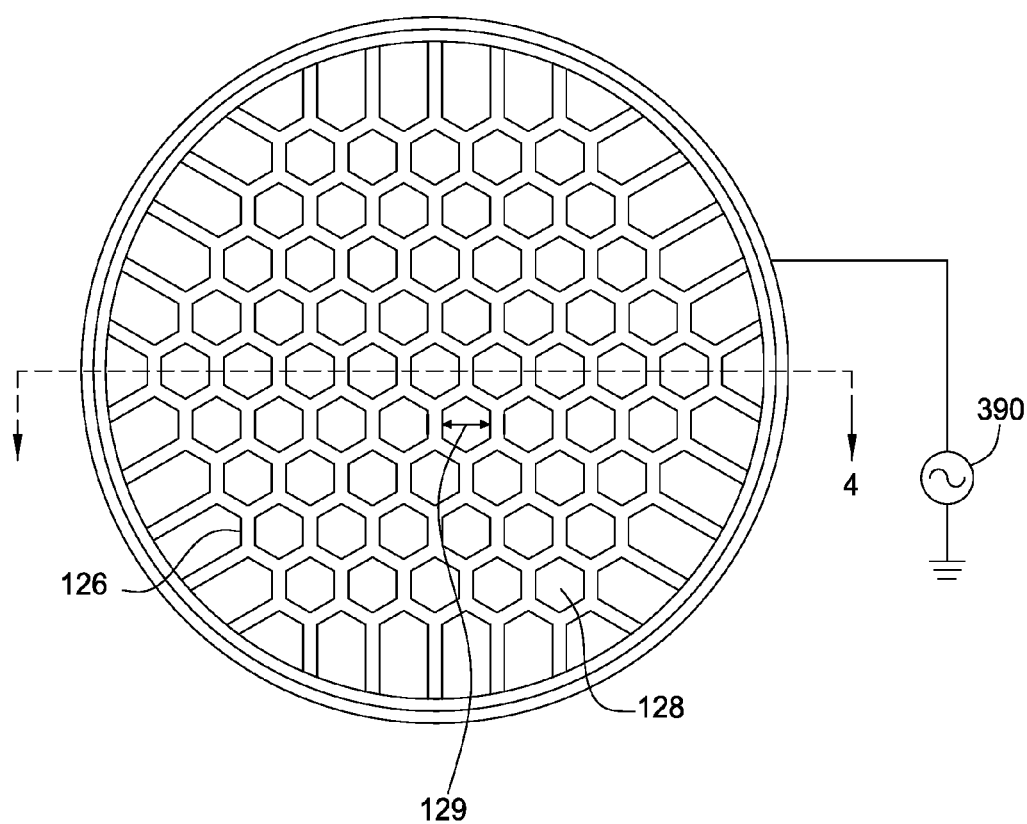
FIG. 3 depicts a top view of the collimator assembly of FIGS. 2A-2B.

FIG. 2A depicts a perspective view of a collimator assembly 108 in accordance with implementations of the present disclosure. FIG. 2B depicts another perspective view of the collimator assembly 108 in accordance with implementations of the present disclosure. FIG. 3 depicts a top view of the collimator assembly 108 of FIGS. 2A-2B that may be disposed in the processing chamber 100 of FIG. 1. The collimator assembly 108 includes a one-piece upper shield portion 186 coupled with a collimator portion 110. The collimator portion 110 includes a plurality of apertures to direct gas and/or material flux within the processing chamber 100.

The collimator portion 110 may be mechanically and electrically coupled to the one-piece upper shield portion 186. In one implementation, the collimator portion 110 may be coupled to a middle shield (not shown), positioned lower in the processing chamber 100. In one implementation, the collimator portion 110 is integral to the one-piece upper shield portion 186, as shown in FIGS. 2A-2B. In one implementation, the collimator portion 110 is welded to the one-piece upper shield portion 186. In one implementation, the collimator portion 110 and the one-piece upper shield portion 186 are machined from a single mass of material. In one implementation, the collimator portion 110 and the one-piece upper shield portion 186 are comprised of a material selected from aluminum, copper, and stainless steel. Alternatively, the one-piece upper shield portion 186 and the collimator portion 110 are formed as separate pieces and coupled together using suitable attachment means, such as welding. In one implementation, the collimator portion 110 may be electrically floating within the processing chamber 100. In one implementation, the collimator portion 110 may be coupled to an electrical power source.

The collimator portion 110 is generally a body or a honeycomb structure 218 having walls 126 defining and separating hexagonal aperture(s) 128 in a close-packed arrangement. An aspect ratio of the hexagonal apertures 128 may be defined as the depth of the hexagonal aperture 128 (equal to the thickness of the collimator) divided by the width 129 of the hexagonal aperture 128. In one implementation, the thickness of the walls 126 is between about 0.06 inches (1.524 millimeters) and about 0.18 inches (4.572 millimeters). In one implementation, the thickness of the walls 126 is between about 0.12 inches (3.048 millimeters) and about 0.15 inches (3.81 millimeters). In one implementation, the collimator portion 110 is comprised of a material selected from aluminum, copper, and stainless steel.

The honeycomb structure 218 of the collimator portion 110 may serve as an integrated flux optimizer to improve the flow path, ion fraction, and ion trajectory behavior of ions passing through the collimator portion 110. In one implementation, the walls 126 adjacent to a shield portion have an entrance angle portion 406 and a radius. The one-piece upper shield portion 186 of the collimator portion 110 may assist in the installation of the collimator portion 110 into the processing chamber 100.

In one implementation, the collimator portion 110 may be machined from a single mass of aluminum. The collimator portion 110 may optionally be coated or anodized. Alternatively, the collimator portion 110 may be made from other materials compatible with the processing environment, and may be comprised of one or more sections. In some implementations, the walls 126 of the collimator portion 110 may be textured (e.g., bead blasted) to improve adhesion of high stress films (e.g., copper alloys) to the walls 126.

In one implementation, the collimator portion 110 may be electrically biased in bipolar mode to control the direction of the ions passing through the collimator portion 110. For example, a controllable direct current (DC) or AC collimator power source 390 may be coupled to the collimator portion 110 to provide an alternating pulsed positive or negative voltage to the collimator portion 110 to bias the collimator portion 110. In some implementations, the power source 390 is a DC power source.

The collimator portion 110 functions as a filter to trap ions and neutral species that are emitted from the material from the sputtering target 142 at angles exceeding a selected angle, near normal relative to the substrate 154. The hexagonal apertures 128 of the collimator portion 110 are designed to allow a different percentage of ions emitted from a center or a peripheral region of the material from the sputtering target 142 to pass through the collimator portion 110. As a result, both the number of ions and the angle of arrival of ions deposited onto peripheral regions and center regions of the substrate 154 are adjusted and controlled. Therefore, material may be more uniformly sputter deposited across the surface of the substrate 154. Additionally material may be more uniformly deposited on the bottom and sidewalls of high aspect ratio features, particularly high aspect ratio vias and trenches located near the periphery of the substrate 154.

Figure 4:
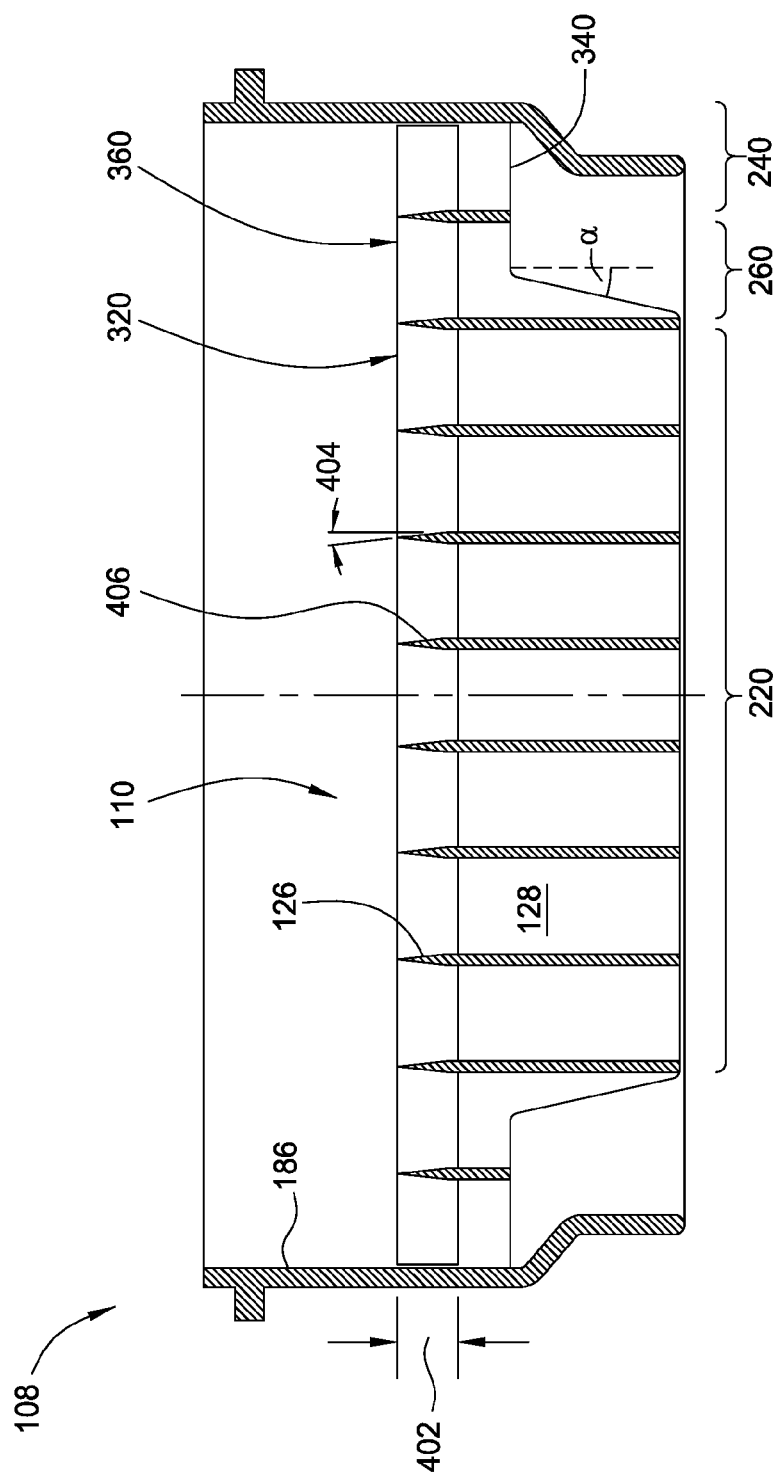
FIG. 4 depicts a cross-sectional view of the collimator assembly of FIGS. 2A-2B in accordance with implementations of the present disclosure.

FIG. 4 depicts a cross-sectional view of the collimator assembly 108 of FIGS. 2A-2B in accordance with implementations of the present disclosure. The collimator portion 110 includes the body or honeycomb structure 218 having a central region 220 having a first plurality of apertures 320 with a high aspect ratio, such as from about 2.5:1 to about 3:1. In one implementation, the aspect ratio of the central region 220 is from about 2.6:1 to about 2.7:1. The aspect ratio of a second plurality of apertures 340 of the collimator portion 110 in an outer peripheral region 240 decreases relative to the first plurality of apertures 320 in the central region 220. In one implementation, the second plurality of apertures 340 in the outer peripheral region 240 have an aspect ratio of from about 1:1 to about 2:1. In one implementation, the second plurality of apertures 340 in the outer peripheral region 240 has an aspect ratio of about 1:1. A higher aspect ratio allows for more apertures in the central region 220 of the collimator portion 110. In one implementation, the central region includes 61 apertures.

In one implementation, the radial decrease of the hexagonal apertures 128 is accomplished by providing a third plurality of apertures 360 in a transitional region 260 disposed between the central region 220 and the outer peripheral region 240. The walls 126 defining the third plurality of apertures 360 are cut along a predetermined angle "α" so that the transitional region 260 forms a conical shape surrounding the first plurality of apertures 320. In one implementation, the predetermined angle is between 15 degrees and 45 degrees. The transitional region advantageously provides a circular profile 280 of apertures in the central region 220 that overcomes the six-point deposition near an edge of the substrate 154 due to shadowing caused by corners of a conventional hexagonal collimator.

Upper portions of the walls 126 defining the hexagonal apertures 128 have an entrance angle portion 406 to decrease a rate at which the hexagonal apertures 128 are clogged by sputtered material. The entrance angle portion 406 extends a predetermined distance 402 into the hexagonal aperture 128 and is formed at a predetermined angle 404. In one implementation, the predetermined distance 402 is between about 0.15 inches (3.81 millimeters) to about 1 inch (2.54 centimeters) and the predetermined angle is between about 2 degrees and about 16 degrees. In one implementation, the predetermined distance 402 and the predetermined angle 404 are about 0.15 inches (3.81 millimeters) and 15 degrees, respectively. In one implementation, the predetermined distance 402 and the predetermined angle 404 are about 1 inch (2.54 centimeters) and 2.5 degrees respectively.

Figure 5A:
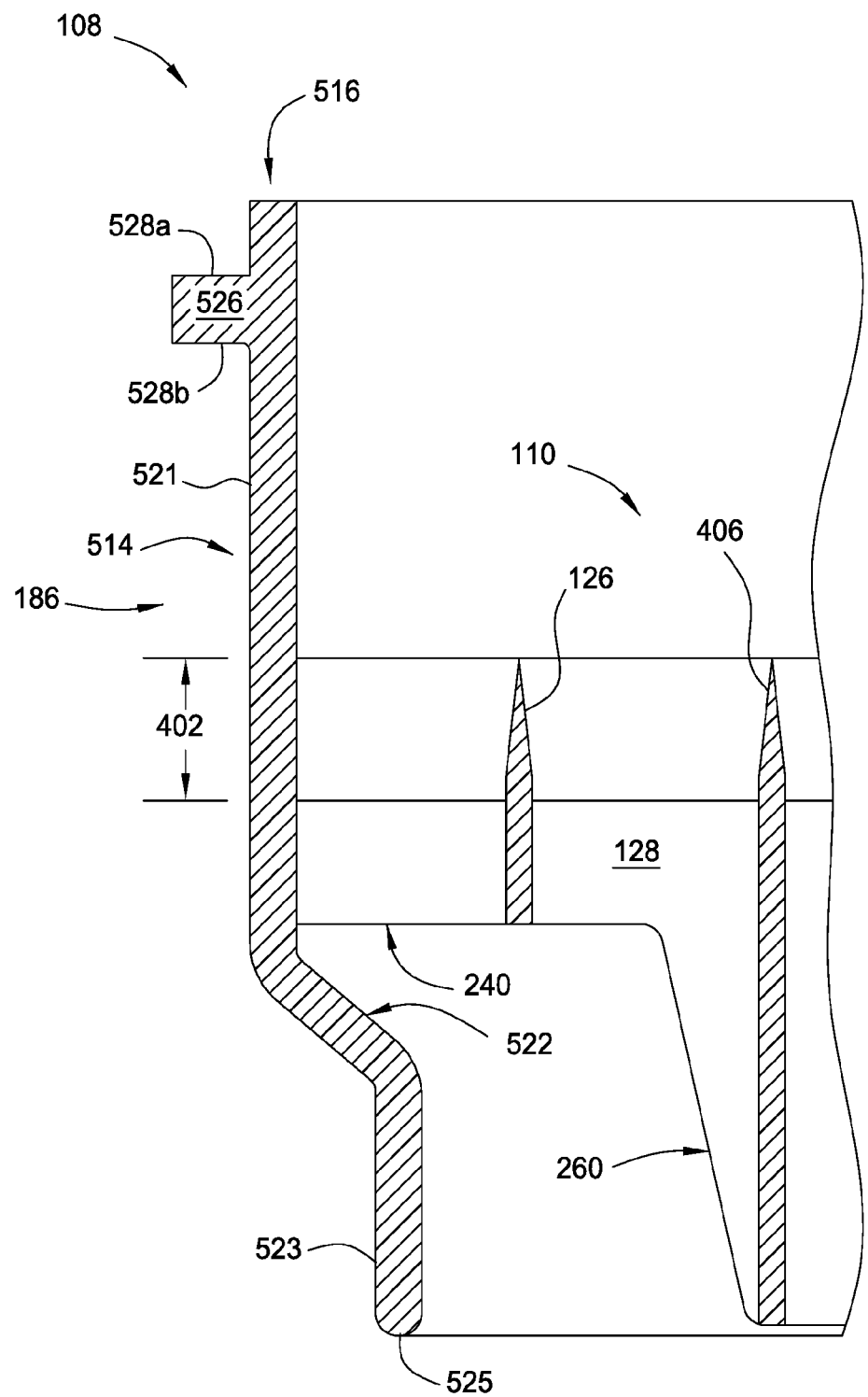
FIG. 5A depicts a cross-sectional view of a portion of the collimator assembly of FIGS. 2A-2B.

FIG. 5A depicts a cross-sectional view of a portion of the collimator assembly 108 of FIGS. 2A-2B. The one-piece upper shield portion 186 has a diameter sized to encircle the sputtering surface 145 of the sputtering target 142 that faces the substrate support pedestal 152, the peripheral edge 153 of the substrate support pedestal 152, and shadows the grounded conductive adapter 144 and the chamber wall 150 of the processing chamber 100. The one-piece upper shield portion 186 serves to reduce deposition of sputtering deposits originating from the sputtering surface 145 of the sputtering target 142 onto the surfaces of the substrate support pedestal 152, overhanging edge of the substrate 154, the grounded conductive adapter 144, the chamber wall 150, and the bottom chamber wall 160 of the processing chamber 100.

The one-piece upper shield portion 186 comprises a top ring 516. There is a support ledge 526 immediately below the top ring 516. The support ledge 526 extends radially outward towards the conductive flange 184 of the processing chamber 100. The support ledge 526 comprises a top surface 528a and a bottom surface 528b. The bottom surface 528b of the support ledge 526 may comprise a plurality of protrusions (not shown) to align the one-piece upper shield portion 186 with the conductive flange 184 supporting the one-piece upper shield portion 186. In one implementation, the support ledge 526 of the one-piece upper shield portion 186 has a plurality of counterbores (not shown) shaped and sized to receive a fastener to affix the one-piece upper shield portion 186 to the conductive flange 184. The support ledge 526 of the one-piece upper shield portion 186 may be secured to the conductive flange 184 by a plurality of fasteners (e.g., screws). In one implementation, the plurality of fasteners is from 30 to 40 (e.g., 36). Increasing the number of fasteners securing the one-piece upper shield portion 186 to the conductive flange 184 provides improved temperature control of the one-piece upper shield portion 186.

Extending downward from the top ring 516 of the one-piece upper shield portion 186 is a cylindrical band 514 having a first vertical or substantially vertical portion 521, a radially inwardly sloped portion 522 and a second vertical or substantially vertical portion 523. The first vertical or substantially vertical portion 521 extends downward from the top ring 516 to the radially inwardly sloped portion 522. The radially inwardly sloped portion 522 has an angle "β" from about 40 to about 50 degrees (e.g., from about 45 to about 50 degrees) relative to the first substantially vertical portion 521 of the cylindrical band 514. As depicted in FIG. 5A, the radially inwardly sloped portion 522 extends across a portion of the second plurality of apertures 340 in the outer peripheral region 240. The second vertical or substantially vertical portion 523 extends downward from the radially inwardly sloped portion 522 and terminated in a rounded edge 525. The radially inwardly sloped portion 522 of the cylindrical band 514 to, for example, provide a surface for sputtered deposits that have flaked off from the top ring 516 and for sputtered deposits from the periphery of the sputtering target 142, to attach thereto. This effectively minimizes the contamination of substrate 154, especially around the edge.

In one implementation, the collimator portion 110 is coupled with the first vertical or substantially vertical portion 521 of the cylindrical band 514. In one implementation, the collimator portion 110 and the first vertical or substantially vertical portion 521 are machined from a single mass of material.

In some implementations, the cylindrical band 514 extends downward from the support ledge 526 to an elevation below the honeycomb structure 218. For example, as depicted in FIG. 5A, the cylindrical band 514 extends to an elevation below the outer peripheral region 240 of the collimator portion 110. In one implementation, the first vertical or substantially vertical portion 521 extends to an elevation below the second plurality of apertures 340 of the outer peripheral region 240 of the collimator portion 110. In one implementation, the second vertical or substantially vertical portion 523 extends to an elevation below the first plurality of apertures 320 of the central region 220 of the collimator portion 110.

Figure 5B:
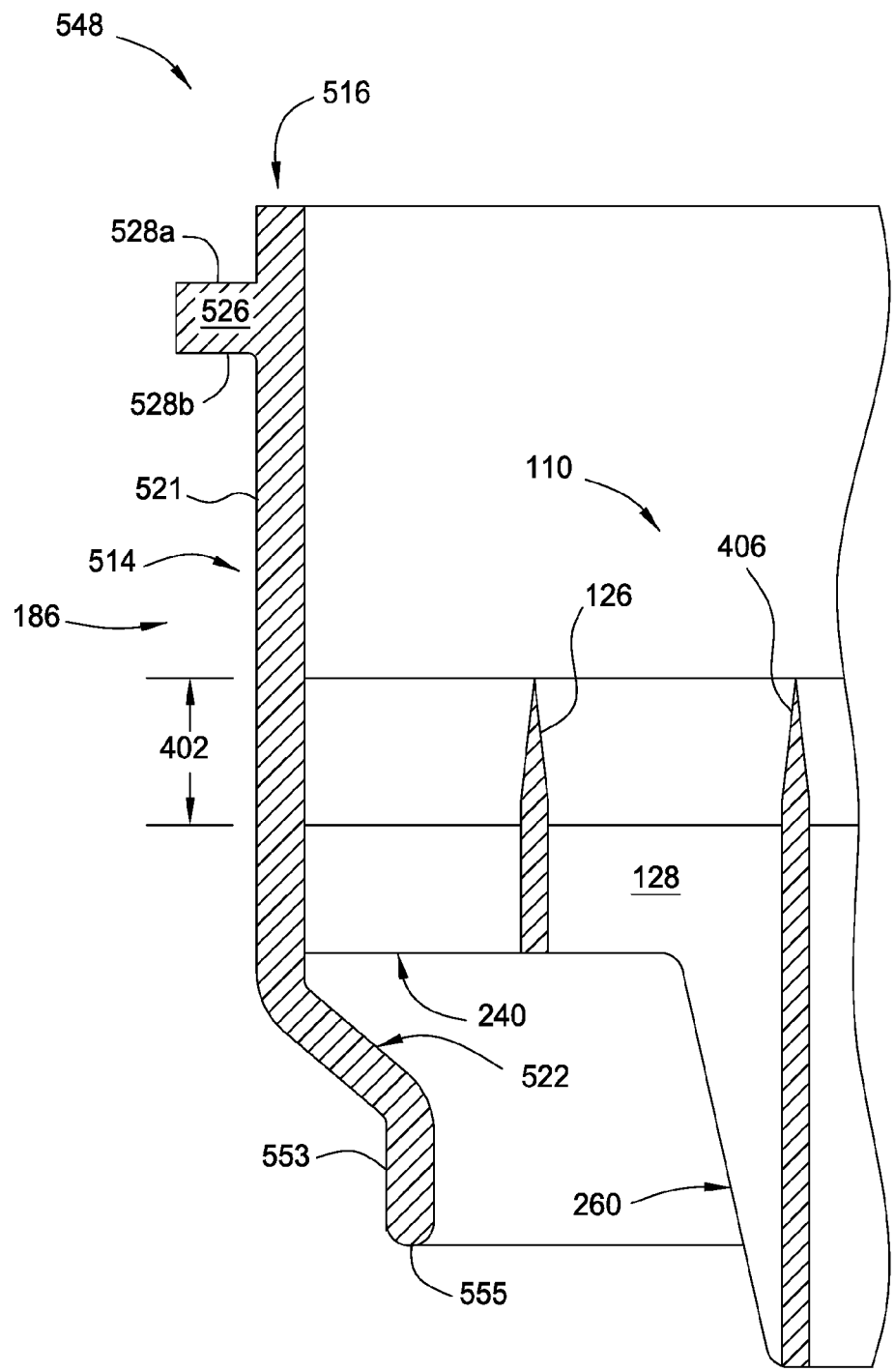
FIG. 5B depicts a cross-sectional view of a portion of another implementation of the collimator assembly of FIGS. 2A-2B.

FIG. 5B depicts a cross-sectional view of a portion of another implementation of a collimator assembly 548 of FIGS. 2A-2B. The collimator assembly 548 of FIG. 5B is similar to the collimator assembly 108 except that the cylindrical band 514 of FIG. 5B is shorter than the cylindrical band 514 of FIG. 5A. Similar to the collimator assembly 108 of FIG. 5A, the cylindrical band 514 of collimator assembly 548 has the first vertical or substantially vertical portion 521, the radially inwardly sloped portion 522 and a second vertical or substantially vertical portion 553. However, the second vertical or substantially vertical portion 553 of collimator assembly 548 is shorter than the second vertical or substantially vertical portion 523 of collimator assembly 108. In one implementation, the second vertical or substantially vertical portion 553 of collimator assembly 548 is shorter than the central region 220 of the honeycomb structure 218. For example, the second vertical or substantially vertical portion 553 extends to an elevation below the second plurality of apertures 340 of the outer peripheral region 240 but does not extend to an elevation below the first plurality of apertures 320 of the central region 220.

Figure 6:
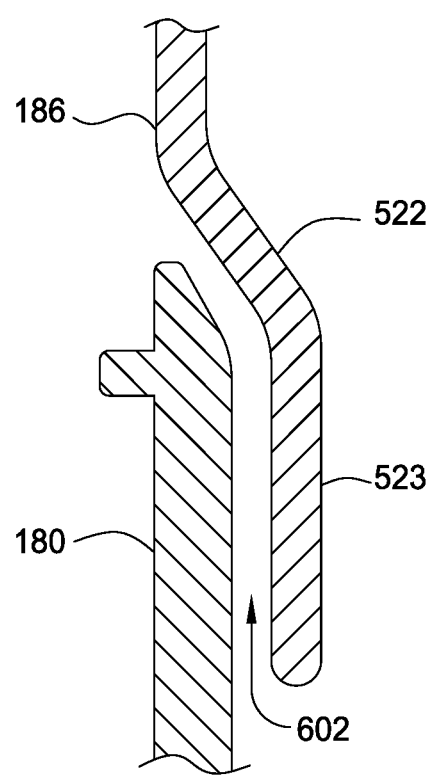
FIG. 6 depicts a partial cross-sectional view of the intersection of the upper shield of the collimator assembly and a lower shield.

FIG. 6 depicts a partial cross-sectional view of the intersection of the one-piece upper shield portion 186 and the one-piece lower shield 180. The second vertical or substantially vertical portion 523 may be positioned to cover the interface between the one-piece lower shield 180 and the one-piece upper shield portion 186, creating a labyrinth gap 602 between the one-piece lower shield 180 and the one-piece upper shield portion 186. The labyrinth gap 602 prevents conductive material from creating a surface bridge between the one-piece lower shield 180 and the one-piece upper shield portion 186, thus maintaining electrical discontinuity.

In summary, some of the benefits of the present disclosure are as follows. In some implementations described herein, a collimator assembly that is biasable is provided. The ability to bias the collimator assembly allows control of the electric field through which the sputter species pass. In some implementations of the present disclosure, a collimator assembly that has a high effective aspect ratio while maintaining a low aspect ratio along the periphery of the collimator assembly of the hexagonal array of the collimator assembly is provided. In some implementations, a collimator assembly with a steep entry edge in the hexagonal array is provided. It has been found that use of a steep entry edge in the collimator assembly substantially reduces deposition overhang and clogging of the cells of the hexagonal array in comparison with prior art collimator designs. In some implementations, a collimator assembly that has a cylindrical band with a radially inwardly sloped portion is provided. The radially inwardly sloped portion provide a surface for sputtered deposits that have flaked off from the other portions of the collimator assembly and for sputtered deposits from the periphery of the sputtering target to attach thereto. The readily inwardly slope portion effectively minimizes the contamination of substrates, especially around the edge. Compared to prior art collimator designs, these various features substantially increase film uniformity and extend the life of the collimator assembly and process kit while reducing periods between cleaning.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

What is claimed is:

1. A collimator assembly, comprising:
   a collimator portion, comprising:
      a honeycomb structure having walls defining and separating hexagonal apertures, wherein the hexagonal apertures include:
         a first plurality of hexagonal apertures in a central region having a first aspect ratio;
         a second plurality of hexagonal apertures in a peripheral region having a second aspect ratio less than the first aspect ratio; and
         a third plurality of hexagonal apertures in a transitional region disposed between the central region and the peripheral region,
      wherein walls defining the third plurality of apertures of the transitional region are cut along an angle to form a conical shape surrounding the central region,
      wherein the conical shape is defined by a circular edge formed by the walls of the transitional region, and
      wherein an upper portion of the walls include an entrance angle portion; and
   a shield portion coupled with the collimator, the shield portion comprising:
      a top ring;
      a support ledge below the top ring, the support ledge extending radially outward; and
      a cylindrical band extending downward from the support ledge to an elevation below the honeycomb structure.

2. The collimator assembly of claim 1, wherein the cylindrical band comprises:
   a first substantially vertical portion; and
   a radially inward sloped portion extending downward from the first substantially vertical portion.

3. The collimator assembly of claim 2, further comprising:
   a second substantially vertical portion extending downward from the radially inward sloped portion.

4. The collimator assembly of claim 2, wherein the radially inward sloped portion extends across a portion of the second plurality of apertures in the peripheral region.

5. The collimator assembly of claim 1, wherein the first plurality of apertures, the second plurality of apertures, and the third plurality of apertures are textured.

6. The collimator assembly of claim 1, wherein the entrance angle portion has a predetermined angle of from about 2 degrees to about 16 degrees.

7. The collimator assembly of claim 6, wherein the entrance angle portion has a predetermined angle of about 2.5 degrees and has a length of about 2.54 centimeters.

8. The collimator assembly of claim 1, wherein the first aspect ratio of the first plurality of apertures is from about 2.5:1 to about 3:1.

9. The collimator assembly of claim 8, wherein the second aspect ratio is from about 1:1 to about 2:1.

10. The collimator assembly of claim 2, wherein the radially inwardly sloped portion has an angle from about 40 to about 50 degrees relative to the first substantially vertical portion.

11. The collimator assembly of claim 3, wherein the radially inwardly sloped portion and the second substantially vertical portion form a labyrinth gap with a lower shield.

12. The collimator assembly of claim 1, wherein the collimator is coupled with a DC power source.

13. A substrate-processing chamber, comprising:
a chamber body defining an inner volume;
a sputtering target disposed in an upper portion of the inner volume;
a substrate support disposed below the sputtering target;
a collimator assembly for encircling the sputtering target, comprising:
a collimator, comprising:
a honeycomb structure having walls defining and separating hexagonal apertures, wherein the hexagonal apertures include:
a first plurality of hexagonal apertures in a central region having a first aspect ratio;
a second plurality of hexagonal apertures in a peripheral region having a second aspect ratio less than the first aspect ratio; and
a third plurality of hexagonal apertures in a transitional region disposed between the central region and the peripheral region,
wherein walls defining the third plurality of apertures of the transitional region are cut along an angle to form a conical shape surrounding the central region,
wherein the conical shape is defined by a circular edge formed by the walls of the transitional region, and
wherein an upper portion of the walls include an entrance angle portion; and
a shield portion coupled with the collimator, comprising:
a top ring;
a support ledge below the top ring, the support ledge extending radially outward; and
a cylindrical band extending downward from the support ledge to an elevation below the honeycomb structure.

14. The substrate-processing chamber of claim 13, wherein the cylindrical band comprises:
a first substantially vertical portion; and
a radially inward sloped portion extending downward from the first substantially vertical portion.

15. The substrate-processing chamber of claim 14, further comprising:
a second substantially vertical portion extending downward from the radially inward sloped portion.

* * * * *